(12) United States Patent
Lee et al.

(10) Patent No.: US 6,211,012 B1
(45) Date of Patent: Apr. 3, 2001

(54) METHOD OF FABRICATING AN ETOX FLASH MEMORY

(75) Inventors: Robin Lee, Hsinchu Hsien; Gary Hong; Hwi-Huang Chen, both of Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/498,330

(22) Filed: Feb. 4, 2000

(30) Foreign Application Priority Data

Jan. 10, 2000 (TW) .............................................. 089100262

(51) Int. Cl.[7] ................................................. H01L 21/336

(52) U.S. Cl. ........................... 438/257; 438/256; 438/296; 438/253; 438/254

(58) Field of Search ..................................... 438/296, 256, 438/257, 399, 210, 253, 254, 264

(56) References Cited

U.S. PATENT DOCUMENTS

| 5,138,573 | * | 8/1992 | Jeuch ..................................... 365/182 |
| 5,751,039 | * | 5/1998 | Kauffman et al. ..................... 257/316 |
| 5,793,673 | * | 8/1998 | Pio et al. .............................. 257/316 |
| 5,844,270 | * | 12/1998 | Kim et al. ............................. 257/315 |
| 5,877,523 | * | 3/1999 | Liang et al. ........................... 257/315 |
| 5,900,656 | * | 5/1999 | Park ....................................... 257/295 |
| 5,956,594 | * | 9/1999 | Yang et al. ............................ 438/396 |
| 5,977,584 | * | 11/1999 | Kim ....................................... 257/315 |
| 6,011,288 | * | 1/2000 | Lin et al. ............................... 257/321 |

* cited by examiner

*Primary Examiner*—Matthew Smith
*Assistant Examiner*—V. Yevsikov
(74) *Attorney, Agent, or Firm*—Jiawei Huang; J. C. Patents

(57) ABSTRACT

A method of fabricating an ETOX flash memory. A low-resistance source line is formed on the substrate to string each source region in one source array by self-aligned process to substitute conventional buried source line. And at the same time, landing pads are formed on the each drain region by a self-aligned process to reduce the fabrication difficulty of the contact plug.

30 Claims, 5 Drawing Sheets

METHOD OF FABRICATING AN ETOX FLASH MEMORY

CROSS-REFERENCE TO RELATED APPLICATION

This application claims the priority benefit of Taiwan application serial no. 89100262, filed Jan. 10, 2000.

BACKGROUND OF THE INVENTION

1. Field of the Invention

The present invention relates to a method of fabricating a semiconductor device, and more particularly to a method of fabricating an ETOX flash memory.

2. Description of the Related Art

ETOX flash memory is a type of erasable programmable read only memory (EPROM) that also incorporates a thin tunnel oxide structure. It is therefore called "ETOX" (EPROM with Tunnel Oxide) flash.

According to a method of fabricating ETOX flash memory cell in the prior art, a plurality of parallel field oxide lines are formed in the substrate to serve as a device isolation structure. Stacked word lines having a tunneling oxide layer, a floating gate, an ONO (oxide-nitride-oxide) layer and a control gate are then formed on the substrate, wherein the stacked word lines are parallel to each other and perpendicular to the field oxide lines. A buried source line and drain region are formed on each side of the stacked word line by implanting ions in the substrate. A contact plug connected to a bit line is formed on the drain region. The buried source line is perpendicular to the field oxide line, and the bit line is parallel to the field oxide line.

Since the buried source line in the prior art crosses the field oxide line, the buried source line is curved and therefore has a varied distribution because of the field oxide line. However, the field oxide line limits the shrinkage of the ETOX flash memory, as the integration of the integrated circuit increases. Hence, shallow trench isolation (STI) lines substituted for the field oxide lines are employed to solve the problem. But, as shown in FIG. 1, while fabricating the buried source line 16, ions 14 are generally implanted in a direction perpendicular to the silicon substrate 10, an distribution of the doped ions follows the profile of the STI lines 12. A very thin ion-doped layer 18 is formed next to the sidewalls of the STI lines 12. Consequently, discontinuity and high resistance may occur somewhere along the source line 16, and operation speed of the ETOX flash memory is therefore decreased.

SUMMARY OF THE INVENTION

The present invention therefore provides a method of fabricating ETOX flash memory. Self-aligned and low-resistance source lines are formed on a substrate to string each source region of the flash memory cells. The source line is employed as a substitute for the conventional buried source line, and the source line resistance can be reduced effectively. The operation speed of the ETOX flash memory is therefore increased.

The invention provides a method of fabricating an ETOX flash memory. The method of the invention comprises the following steps. A plurality of parallel device isolation lines, such as shallow trench isolation lines, is formed in a substrate. A plurality of parallel stacked word lines is formed on the substrate and in a direction perpendicular to the device isolation lines. A plurality of parallel source arrays and drain arrays are alternately positioned in the substrate between neighboring stacked word lines. Each source array has a plurality of source regions separately positioned between device isolation lines and each drain array also has a plurality of drain regions separately positioned between device isolation lines. A plurality of patterned first insulating layers is then formed, wherein each first insulating layer is on part of the device isolation lines between neighboring drain regions of one drain array. A plurality of source lines is formed on the source arrays, and a plurality of landing pads is formed on the drain regions at the same time. Each source line is electrically connected to the source regions of one source array. Each landing pad is electrically connected to a corresponding drain region. A second insulating layer is formed over the substrate. A plurality of contact plugs is formed in the second insulating layer, and a plurality of parallel bit lines running parallel to the device isolation lines is formed on the second insulating layer, wherein the contact plugs are electrically connected to the drain regions and bit lines.

According to the method of the invention, the flash memory is compact and small flash memory cells are made. Moreover, low-resistance source lines are formed on the source arrays to string the source region of each source array. Hence, the source lines can be made of low-resistance materials, and the implant dosage of the source region can be adjusted according to the device characteristic without affecting the source line resistance. In addition, landing pads are formed at the same time while forming the source line. The landing pads can reduce the aspect radio of the contact plugs, and thus decrease the etching difficulty of the contact windows while fabricating contact plugs. Furthermore, the source lines and landing pads are formed self-aligned and the fabricating process can be simplified.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
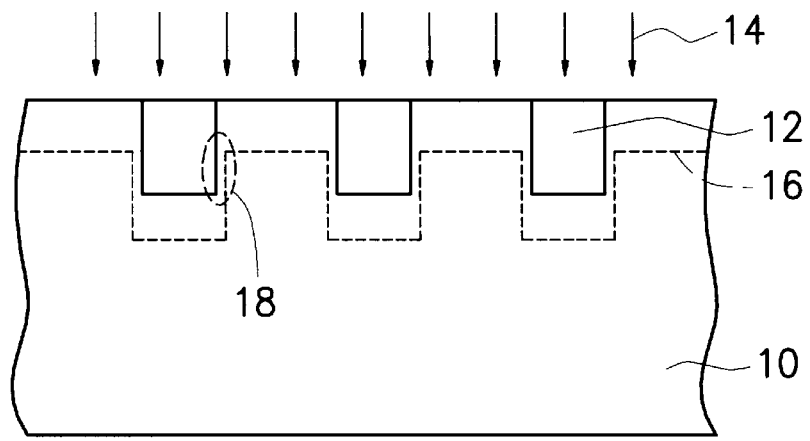
FIG. 1 is schematic, cross-sectional view illustrating fabrication of a flash memory in the prior art, wherein a discontinuity of the source line is formed close-by the sidewall of the shallow trench isolation.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A–2H are schematic, three-dimensional views illustrating fabrication of a flash memory according to one preferred embodiment of the present invention.

Figure 2A:
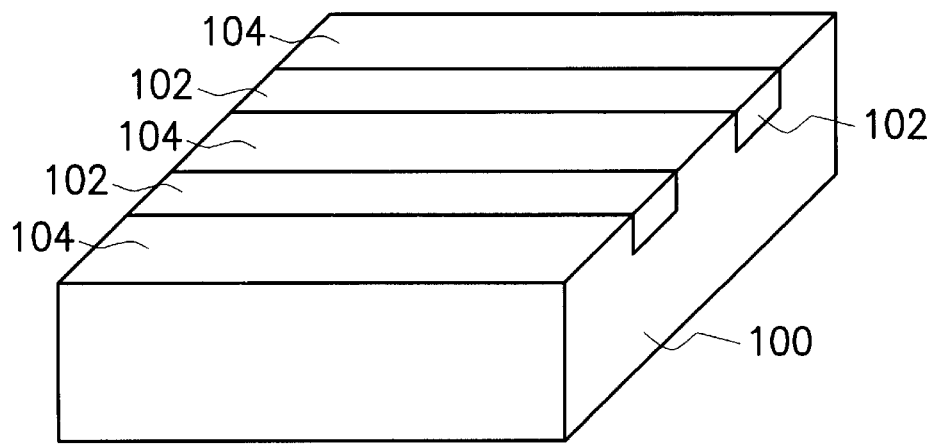
FIGS. 2A–2H are schematic, three-dimensional views illustrating fabrication of a flash memory according to one preferred embodiment of the present invention.

Referring to FIG. 2A, a semiconductor substrate 100 is provided. A plurality of parallel device isolation lines 102 is formed in the substrate 100. The regions between device isolation lines are active areas 104. The device isolation line 102, for example, can be a field oxide (FOX) layer or a shallow trench isolation (STI) structure. It is preferable that STI is selected, so that the integration of the flash memory can be advanced.

Figure 2B:
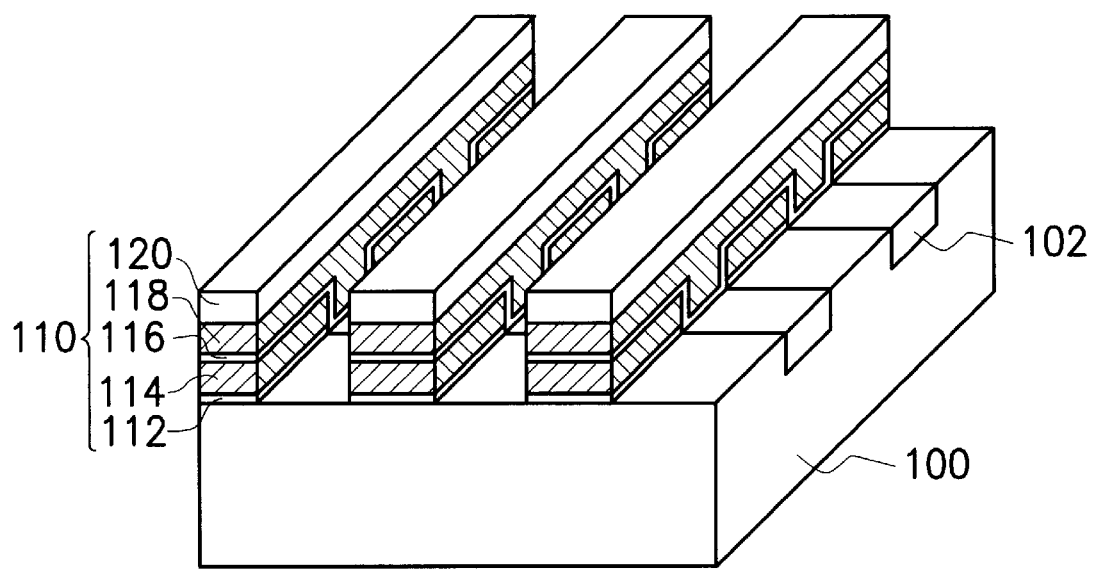

Referring to FIG. 2B, a plurality of stacked word lines 110 is formed on the substrate 100. The stacked word lines 110 are parallel to each other and perpendicular to the device isolation lines 102. Each stacked word line 110 is a stacked of a tunneling oxide layer 112, a floating gate 114, a dielectric layer 116, a control gate 118, and a cap layer 120. Fabrication of the stacked word line 110 can be the following exemplary steps. A silicon oxide layer and a first polysilicon layer, such as a doped polysilicon layer, are formed in sequence on the substrate 100 to fabricate the tunneling oxide layer 112 and floating gate 114. The silicon oxide layer and first polysilicon layer are patterned to form a plurality of lines on the active area 104. The patterned lines are parallel to device isolation lines 102. A thin and conformal dielectric layer, such as oxide-nitride-oxide (ONO) layer, is deposited over the substrate 100. A second polysilicon layer, such as a doped polysilicon layer and a cap layer, such as a silicon nitride layer, are formed on the ONO layer to fabricate the control gate 118 and cap layer 120. The foregoing stacked layers are patterned to form a plurality of stacked word lines 110 running perpendicular to the device isolation lines 102. For each flash memory cell, the tunneling oxide layer 112 and floating gate 114 are floating on the active area 104. The dielectric layer 116, control gate 118 and cap layer 120 string the tunneling oxide layer 112 and floating gate 114 of each memory cell. The above said steps are well known to those of the skilled in the art, and so the method of fabrication will not be described any further.

Figure 2C:
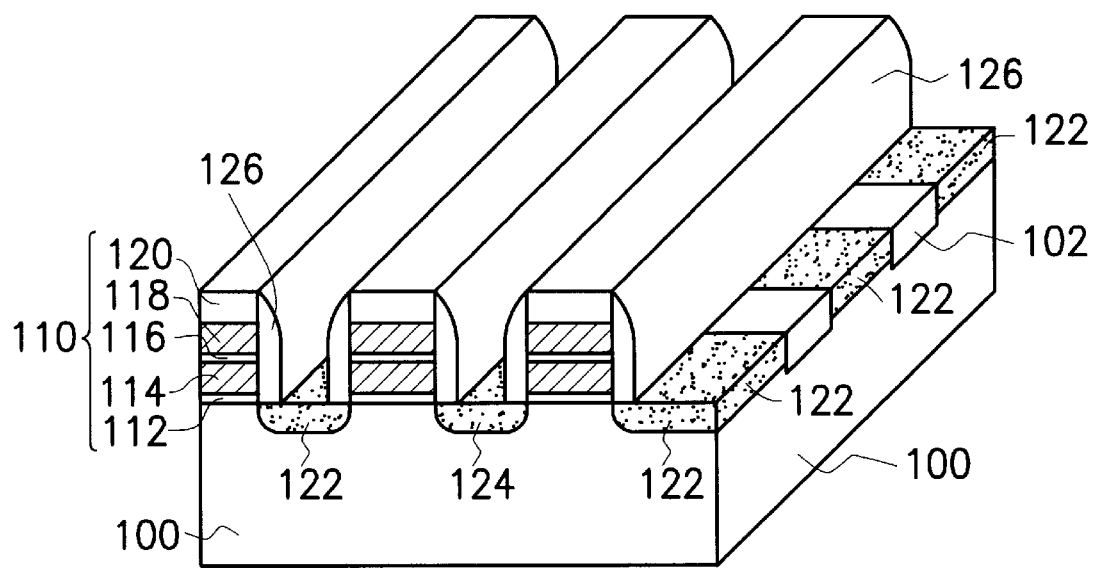

Referring to FIG. 2C, a doping process, such as ion implantation, is employed to form a plurality of source arrays and drain arrays between the stacked word lines 110. As shown in FIG. 2C, the source arrays and drain arrays are parallel to the stacked word lines 110, and are alternately located neighboring stacked word lines. Each source array has a plurality of source regions 124 separately positioned between device isolation lines 102. Each drain array has a plurality of drain regions 122 separately positioned between device isolation lines 102.

A plurality of spacers 126 is formed on the sidewalls of the stacked word lines 110. The spacers 126 can be made by the following exemplary steps. A silicon nitride layer is deposited over the substrate 100 by chemical vapor deposition (CVD). A etch back process is carried out to remove the silicon nitride layer on the stacked word line 110 and substrate 100, and a part of the silicon nitride layer is left on the sidewalls of the stacked word lines 110 to serve as spacer 126.

Figure 2D:
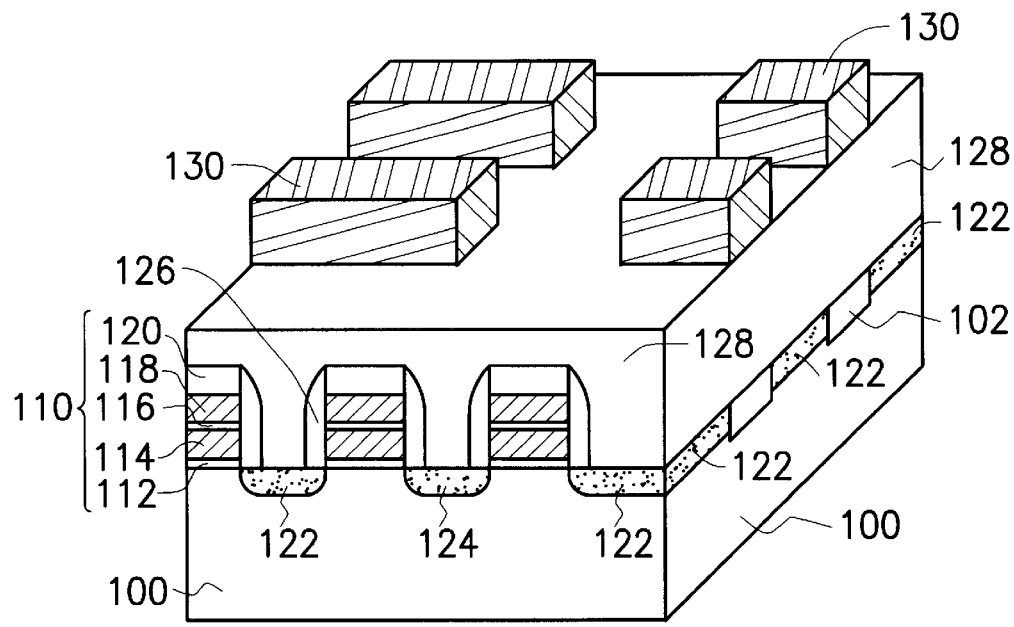

Referring FIG. 2D, a first insulating layer 128, such as a silicon oxide layer made by using TEOS as a reactant in a chemical vapor deposition process, is deposited over the whole substrate 100. Next, a chemical mechanical polishing (CMP) process is carried out to planarize the first insulating layer 128. A photoresist layer 130 is formed on the first insulating layer 128. The photoresist layer 130 is then patterned by conventional photolithography technology to form the required pattern. The patterned photoresist layer 130 is like a bar covering the part of device isolation line 102 between neighboring drain regions 122 of one drain array.

Figure 2E:
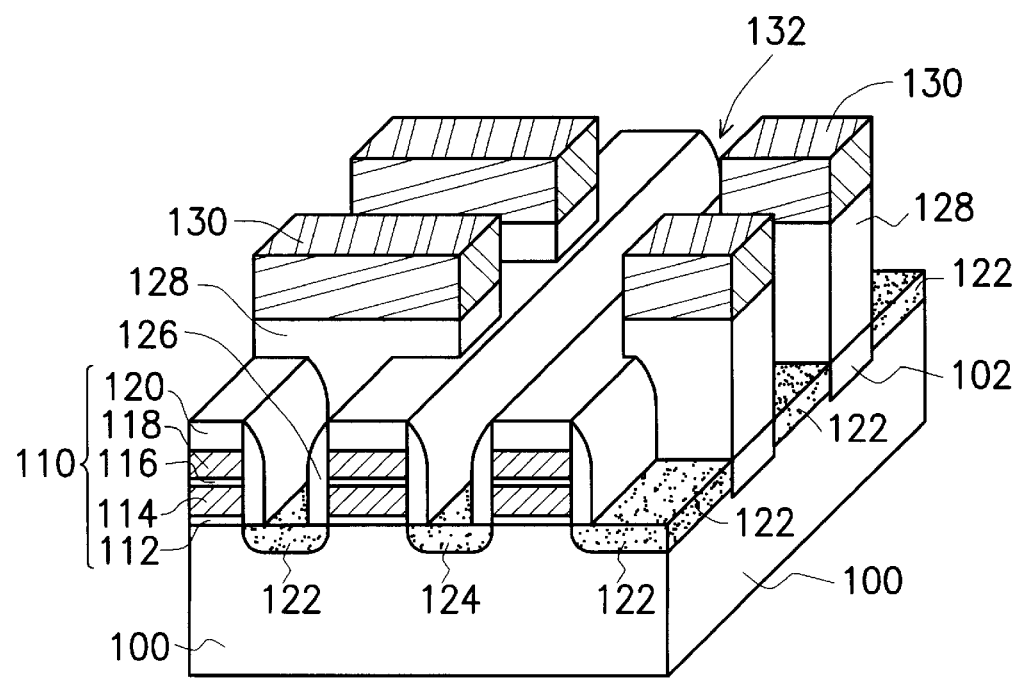

Referring to FIG. 2E, the first insulating layer 128 is etched by, for example, reactive ion etching (RIE) while using the patterned photoresist layer 130 as a mask to form a trench 132 exposing the source array and individual drain region 122 (separated by patterned first insulating layer 128) in the patterned first insulating layer 128.

Figure 2F:
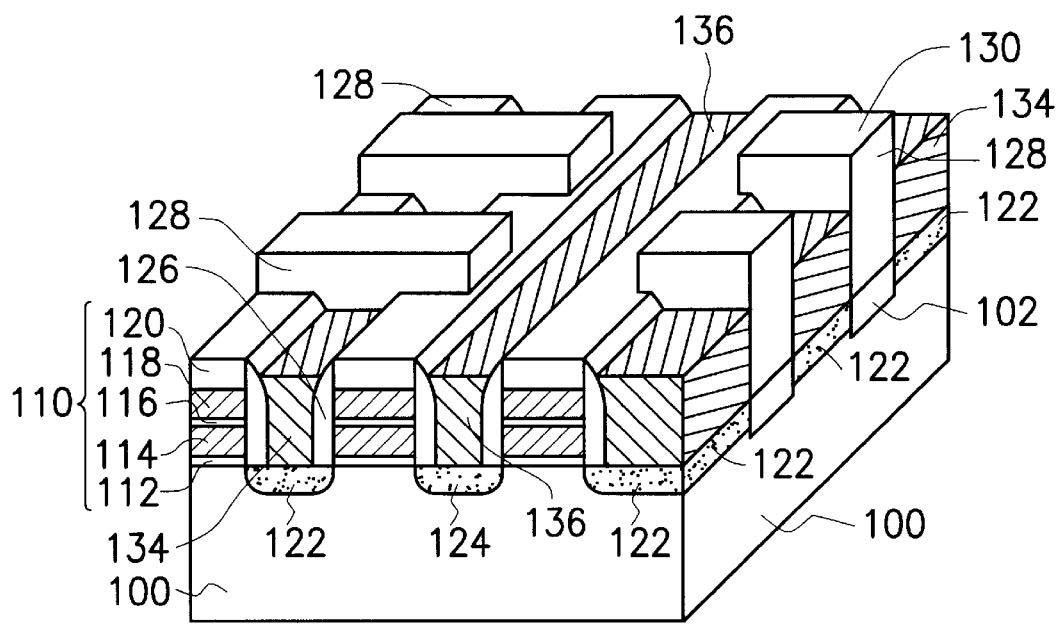

Referring to FIG. 2F, a first conductive material layer, such as tungsten (W), aluminum (Al) or doped polysilicon layer, or other low-resistance conductive materials is formed to fill the trench 132, but the first conductive material layer cannot be higher than the stacked word lines 110. Therefore, self-aligned and continuous source lines 136 are formed on the each source array, and at the same time, self-aligned landing pads 134 are formed on the corresponding drain regions 122. Each source line 136 is electrically connected to the source regions of one source array, and the landing pads 134 are electrically connected to the drain regions 122. For example, if the material of the source line 136 and landing pad 13 is tungsten, they can be made by the following steps. A tungsten layer made by physical vapor deposition (PVD) is formed over the substrate 100. A blanket etch back process is performed to etch the exposed tungsten layer until the tungsten layer is lower than the stacked word lines 110 (i.e. the tungsten layer on the stacked word lines 110 and first insulating layer 128 is removed). The source lines 136 and landing pads 134 are therefore formed. Another way of forming the source line 136 and landing pad 134 is to use selective tungsten deposition under well-chosen process conditions until the deposited tungsten surrounds the cap layer 120. In addition, a self-aligned process can be carried out to form a metal silicide layer, such as a titanium silicide ($TiSi_2$) layer, to reduce the resistance of the source region 124 and drain region 122 before filling the trench 132 with the first conductive layer. Moreover, a barrier layer, such as a silicon nitride layer, can be formed to prevent a spike of the aluminum layer.

According to the present invention, self-aligned and low-resistance source lines 136 are formed on the source arrays to string the source regions of each source array. The source line 136 is used as a substitute for the conventional buried source line so that a problem of discontinuity in the prior art can be resolved. It also has other advantages. The method of the invention can omit one photolithography process. The source line is made of a low-resistance material. Hence, the resistance of the source line is reduced, and the operation speed of the ETOX flash memory can be improved. Furthermore, forming the landing pad 134 on the drain region 122 can lower the aspect radio of a contact window, which is subsequently formed on the landing pad 134, so that the etching difficulty while fabricating the contact window will be decreased. In addition, as a result of the source region and the source line being formed separately, the implant dosage of the source region can be adjusted according to the device characteristic without affecting the resistance of the source line.

Figure 2G:
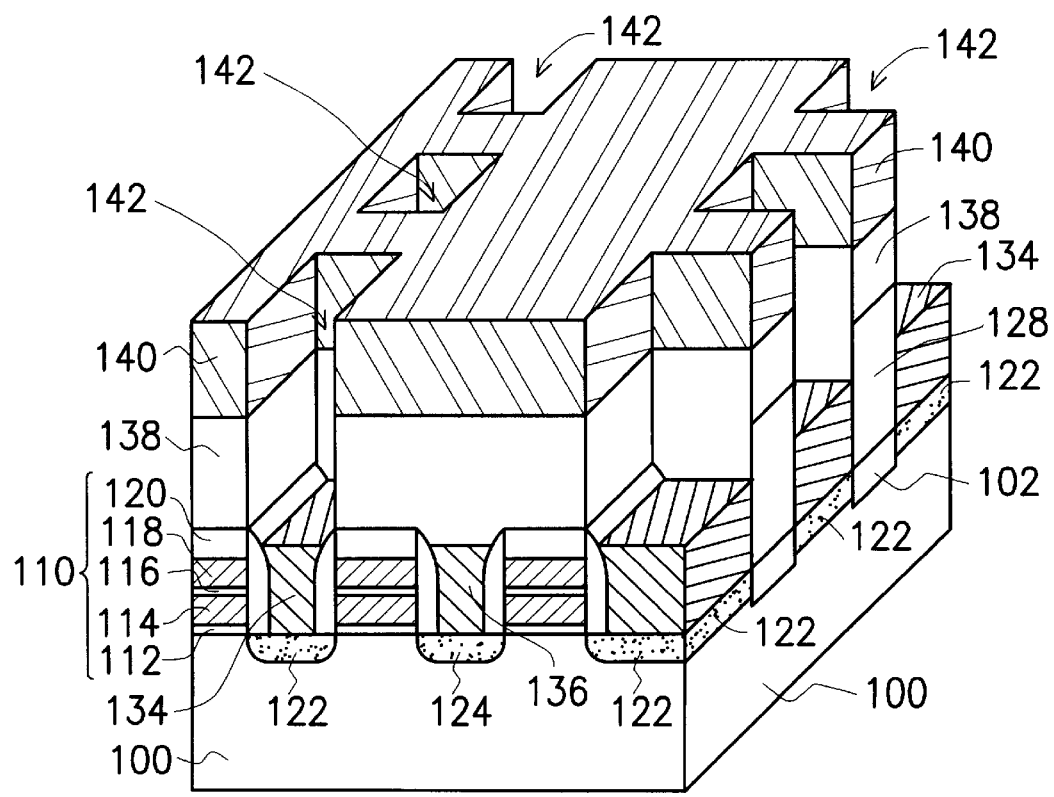

Referring to FIG. 2G, a second insulating layer 138, such as a silicon oxide layer made by chemical vapor deposition, is formed over the substrate 100. A chemical mechanical polishing process is employed to planarize the second insulating layer 138. A photoresist layer 140 is formed on the second insulating layer 138. The photoresist layer 140 is then patterned by photolithography technology. The second insulating layer 138 is etched by, for example, reactive ion etching (RIE) to form a contact window 142 therein, to expose the landing pad 134. Since the landing pad 134 has been formed on the drain region 122, the contact window 142 needs not expose the drain region 122. Consequently, the aspect radio of the contact window 142 can be reduced, and the etching difficulty can be decreased while forming the contact window 142.

Figure 2H:
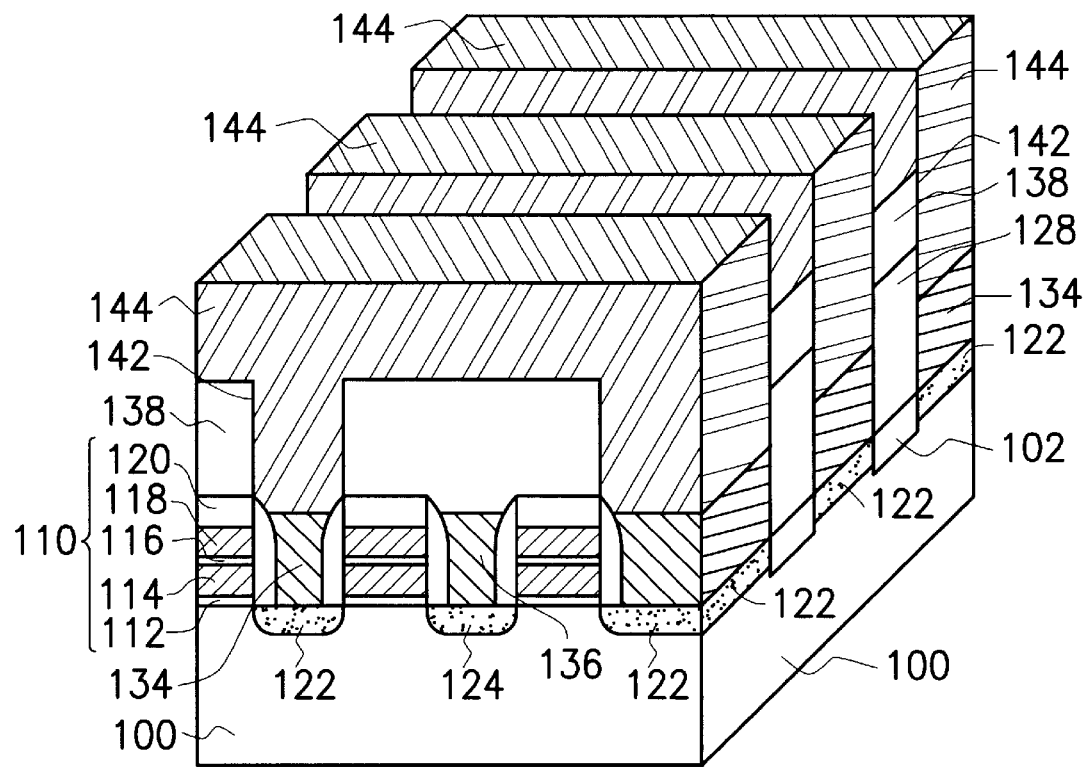

Referring to FIG. 2H, a plurality of bit lines 144 made of, for example, tungsten or aluminum, is formed on the insulating layer 138. The bit lines 144 are parallel to each other, and parallel to the device isolation lines 102. And at the same time, a plurality of contact plugs electrically connected to the landing pad 134 is formed in the contact window 142. The bit lines 144 and contact plugs can be made by the following exemplary steps. A tungsten layer is formed over the substrate 100 by PVD to fill the contact window 142, and contact plugs are formed therein. Then, a conventional photolithography and etching technology is employed to pattern the tungsten layer, and thus the parallel bit lines 144 are formed. The bit lines 144 connect to the drain regions 122 through the contact plugs.

Figure 3:
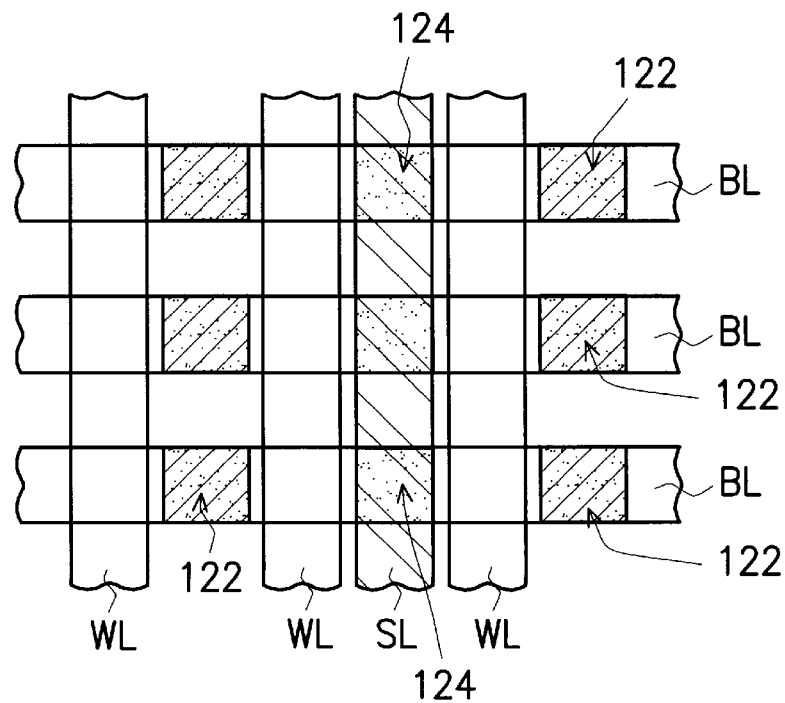
FIG. 3 is schematic, a layout illustrating FIGS. 2A–2H.

In order to further understanding the present invention, FIG. 3 is used. FIG. 3 is a schematic layout of the present invention. Reference is simultaneously made to FIGS. 2A–2H and FIG. 3. As shown in FIG. 3, parallel word lines (WL) are the stacked word lines 110 in FIGS. 2A–2H. Source arrays and drain arrays are alternatively located between the neighboring word lines (WL). Each source array has a plurality of separated source region 124, and each drain array has a plurality of separated drain region 122. The source lines (SL) string the source regions of one source array. Bit lines (BL) are perpendicular to the word lines (WL) and connect to the drain region 122 through the landing pads and contact plugs (i.e. the landing pads, contact plugs and drain regions are overlaid). The ETOX flash memory according to the present invention is compact and has small size flash memory cells.

According to the embodiment of the invention, the advantages of the invention includes:

1. The flash memory is compact, and small size flash memory cells are made.
2. The source lines and the source regions are separately formed. Hence, the source lines can be made of low-resistance materials, and the implant dosage of the source regions can be adjusted according to the device characteristic without affecting the source line resistance.
3. Landing pads are formed on the drain regions at the same time while forming the source line. The landing pads can reduce the aspect radio of the contact window, and thus decrease fabricating difficulty of the contact window.
4. Formation of the source lines and landing pads is a self-aligned process and simplifies the fabrication process.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating an ETOX flash memory adapted for a semiconductor substrate, the method comprising:

providing the semiconductor substrate, the substrate comprising an active region isolated by an isolation structure therein;

forming a stacked word line perpendicularly across the isolation structure on the substrate;

forming a source region and a drain region in the active region isolated by the isolation structure on both sides of the stacked word line;

forming spacers on sidewalls of the stacked word line;

forming a first insulating layer over the substrate;

removing parts of the first insulating layer to form a patterned trench exposing the source region and the drain region, while the isolation structure at the same side of the source region is exposed, and the isolation region at the same side of the drain region is covered by the first insulating layer;

forming a first conductive material layer inside the trench to form a source line on the source region and the isolation structure at the same side of the source region and a landing pad on the drain region only;

forming a second insulating layer over the substrate;

removing parts of the second insulating layer to form a contact window that exposes the landing pad; and forming a contact plug in the contact window and a bit line on the second insulating layer, wherein the contact plug is electrically connected to the drain region and the bit line.

2. The method according to claim 1, wherein the stacked word line is a stack of tunneling oxide layer, floating gate, dielectric layer, control gate and cap layer.

3. The method according to claim 2, wherein a material of the floating gate comprises doped polysilicon.

4. The method according to claim 2, wherein the dielectric layer comprises a stack of silicon oxide layer, silicon nitride layer, and silicon oxide layer.

5. The method according to claim 2, wherein a material of the control gate comprises doped polysilicon.

6. The method according to claim 2, wherein a material of the cap layer comprises silicon nitride.

7. The method according to claim 1, wherein the step of forming the source region and drain region includes implanting ions into the exposed substrate.

8. The method according to claim 1, wherein a material of the spacers comprises silicon nitride.

9. The method according to claim 1, wherein the first conductive material comprises tungsten.

10. The method according to claim 1, wherein the first conductive material comprises aluminum.

11. The method according to claim 1, wherein the first conductive material comprises doped polysilicon.

12. The method according to claim 1, wherein the step of forming the first conductive material layer inside the trench, comprises:

forming a conductive material layer; and performing a blanket etch back process until exposing the stacked word line.

13. The method according to claim 1, wherein a material of the contact plug and bit line comprises tungsten.

14. The method according to claim 1, wherein a material of the contact plug and bit line comprises aluminum.

15. A method of fabricating an ETOX flash memory adapted for a semiconductor substrate, the method comprising:

forming a plurality of parallel device isolation lines in the substrate;

forming a plurality of parallel stacked word lines on the substrate, wherein the stacked word lines are perpendicularly accross the device isolation lines;

forming a plurality of parallel source arrays and parallel drain arrays alternately positioned in the substrate between the neighboring stacked word lines, wherein each source array has a plurality of source regions separately positioned between device isolation lines and each drain array has a plurality of drain regions separately positioned between device isolation lines;

forming a plurality of spacers on sidewalls of the stacked word lines;

forming a first insulating layer to cover the device isolation lines surrounded by the stacked word lines and the drain regions only, while the source regions and the device isolation lines surrounded by the source regions and the stacked word lines are exposed;

forming a plurality of source lines on the source arrays and across the device lines surrounded by the source regions and the stacked word lines, and a plurality of landing pads on the drain regions only;

forming a second insulating layer over the substrate; and forming a plurality of contact plugs in the second insulating layer and a plurality of parallel bit lines on the second insulating layers, wherein the contact plugs are electrically connected to the drain regions and the bit lines, and the bit lines are parallel to the device isolation lines.

16. The method according to claim 15, wherein the device isolation lines comprise field oxide layer.

17. The method according to claim 15, wherein the device isolation lines comprise shallow trench isolation structure.

18. The method according to claim 15, wherein the stacked word lines are stacks of tunneling oxide layer, floating gate, dielectric layer, control gate, and cap layer.

19. The method according to claim 18, wherein a material of the floating gate comprises doped polysilicon.

20. The method according to claim 18, wherein the dielectric layer is a stack of silicon oxide layer, silicon nitride layer, and silicon oxide layer.

21. The method according to claim 18, wherein a material of the control gate comprises doped polysilicon.

22. The method according to claim 18, wherein a material of the cap layer comprises silicon nitride layer.

23. The method according to claim 15, wherein the step of forming the source region and drain region includes implanting ions into the exposed substrate.

24. The method according to claim 15, wherein a material of the spacers comprises silicon nitride.

25. The method according to claim 15, wherein a material of the source lines and landing pads comprises tungsten.

26. The method according to claim 15, wherein a material of the source lines and landing pads comprises aluminum.

27. The method according to claim 15, wherein a material of the source lines and landing pads comprises doped polysilicon.

28. The method according to claim 15, wherein the step of forming the source lines and landing pads comprises:

forming a conductive material layer over the substrate; and performing a blanket etch back process until exposing the stacked word lines.

29. The method according to claim 15, wherein a material of the contact plugs and bit lines comprises tungsten.

30. The method according to claim 15, wherein a material of the contact plugs and bit lines comprises aluminum.

* * * * *